United States Patent
Nebashi et al.

(10) Patent No.: US 8,387,236 B2
(45) Date of Patent: Mar. 5, 2013

(54) APPARATUS FOR MOUNTING CONDUCTIVE BALLS

(75) Inventors: Toru Nebashi, Kamiina-gun (JP); Shigeaki Kawakami, Chino (JP)

(73) Assignee: Athlete Fa Corporation, Suwa-Shi, Nagano (JP)

( * ) Notice: Subject to any disclaimer, the term of this patent is extended or adjusted under 35 U.S.C. 154(b) by 633 days.

(21) Appl. No.: 12/484,516

(22) Filed: Jun. 15, 2009

(65) Prior Publication Data

US 2009/0307899 A1 Dec. 17, 2009

Related U.S. Application Data

(62) Division of application No. 10/576,787, filed as application No. PCT/JP2005/012095 on Jun. 30, 2005, now abandoned.

(30) Foreign Application Priority Data

Jun. 30, 2004 (JP) .................................. 2004-192364
Dec. 21, 2004 (JP) .................................. 2004-369087

(51) Int. Cl.
B23P 19/00 (2006.01)

(52) U.S. Cl. .......................................... 29/745; 29/740

(58) Field of Classification Search .................... 29/745, 29/740, 832, 840, 842, 846
See application file for complete search history.

(56) References Cited

U.S. PATENT DOCUMENTS

| 5,431,332 | A | 7/1995 | Kirby et al. |
| 5,655,704 | A | 8/1997 | Sakemi et al. |
| 6,402,014 | B1 | 6/2002 | Inoue et al. |
| 6,634,545 | B2 | 10/2003 | Razon et al. |
| 6,869,008 | B2 | 3/2005 | Inoue et al. |

FOREIGN PATENT DOCUMENTS

| JP | 09-148332 | * | 6/1997 |
| JP | 9-148332 | A | 6/1997 |
| JP | 2001-244288 | A | 9/2001 |
| JP | 2003-258016 | A | 9/2003 |
| JP | 3635068 | B2 | 1/2005 |

* cited by examiner

*Primary Examiner* — Thiem Phan
(74) *Attorney, Agent, or Firm* — Buchanan Ingersoll & Rooney PC

(57) ABSTRACT

A head that moves across a surface of a mask, which includes a plurality of apertures for disposing conductive balls on a substrate, whereby, while the head is rotating about an axis that is perpendicular to the mask, the axis moves across the surface of the mask. The head includes a gatherer that gathers the conductive balls into a circular area that is smaller than the surface of the mask and disposed around a center of rotation of the head, the conductive balls being gathered from an area around the circular area when the head rotates.

11 Claims, 10 Drawing Sheets

(a)

(b)

(a)

(b)

APPARATUS FOR MOUNTING CONDUCTIVE BALLS

CROSS-REFERENCE TO RELATED APPLICATIONS

This application is a divisional of U.S. application Ser. No. 10/576,787, filed Apr. 21, 2006 which was filed as PCT International Application No. PCT/JP2005/012095 on Jun. 30, 2005, and which claims priority to Japanese Patent Application No. 2004-192364, filed on Jun. 30, 2004 and Japanese Patent Application No. 2004-369087, filed on Dec. 21, 2004, the entire contents of which are incorporated herein by reference.

TECHNICAL FIELD

The present invention relates to an apparatus and method for mounting conductive balls to predetermined positions on a substrate.

BACKGROUND ART

When installing or implementing semiconductor devices and/or optical devices as represented by LSIs (Large Scale Integrated circuits) and LCDs (Liquid Crystal Displays), solder balls are used to produce electrical connections. In recent years, investigations have been carried out into mounting minute particles that are conductive balls including solder balls and other type of balls made of any conductive metals or balls coated with metal, with a diameter of 1 mm or less onto a substrate.

Japanese Laid-Open Patent Publication No. H09-148332 (hereinafter reference publication 1) discloses one example of a technology that arranges minute particles at desired positions. This publication discloses moving minute particles on a mask with apertures for arranging the minute particles by a moving means called a squeegee that has a predetermined softness to insert the minute particles into the apertures, with the minute particles being arranged held on a porous substrate by the suction air.

The squeegee in the reference publication 1 is used to move excess particles that have not been inserted into the apertures. In the reference publication 1, the squeegee is moved by being attached to a belt that moves in a linear direction above the mask. The reference publication 1 also states that above the mask in which a ring-shaped gutter is formed, the squeegee that is attached to a disc-shaped holding member is moved along the gutter. In either case, the minute particles are moved by the squeegee in one predetermined direction. A squeegee that moves back and forth is also disclosed, but in such case, the movement direction consists of just two directions, an "out" direction and a "return" direction.

In the reference publication 1, by inserting the minute particles into the apertures using suction air, the minute particles are appropriately arranged at the necessary positions. Regardless of the presence or absence of suction air, one condition for the minute particles, that is, the conductive balls, to fill the apertures or openings provided in a pattern in the mask without missing any apertures is for a sufficiently large number of conductive balls to be supplied relative to the number of apertures (the density of the apertures). However, if the number of conductive balls is large relative to the number of apertures, time (life time) of moving the conductive balls over the surface of the mask becomes long. During the time, due to a number of factors, such as contact with the atmosphere, contact between balls, contact between the balls and the mask, friction and contact between the balls and the squeegee, abrasion and deformation are caused for the surfaces of the balls, which reduce the performance of the balls as electrodes. Accordingly, if a large number of conductive balls are moved in an attempt to reduce the number of unfilled apertures, or to reduce arrangement errors or mounting errors for a substrate (work) due to unfilled apertures, there is an increase in the probability of problems occurring for the conductive balls disposed on the substrate. In addition, when a method that moves a large number of balls is used, since it is necessary to discard a large number of conductive balls that have not been disposed, there is an increased rate of loss for the conductive balls that is not preferable from a cost perspective.

When the conductive balls are moved in the same direction by the squeegee, due to the squeegee conditions, the mask conditions, and the like, variations in density of the conductive balls are likely to occur in the longitudinal direction of the squeegee, which can lead to fail of filling of apertures and fail of placing of balls. When the amount moved by the conductive balls is increased in an attempt to improve the yield, this results in an increased loss of balls in the same way as described above. In the apparatus described in the reference publication 1, the squeegee is moved back and forth over the mask to reduce failure of filling the apertures. However, since the number of particles inserted into the apertures during one time of the movement of the squeegee falls when the times of the back and forth movement are increased, the damage to the particles due to such movement proceeds.

DISCLOSURE OF THE INVENTION

It is a first object of the present invention to provide a method and apparatus that can highly reliably fill a plurality of apertures in a mask with conductive balls and can highly reliably arrange or mount conductive balls at predetermined positions on a substrate. It is another object of the present invention to provide a method and apparatus that can reduce a rate of discarded for conductive balls and can economically mount conductive balls at predetermined positions on a substrate.

Instead of moving the conductive balls in one direction or in back and forth directions using a squeegee that moves across the entire surface of the mask in one direction or in back and forth directions, the present invention includes gathering the balls in an area that is part of the surface of the mask by rotating the head, holding a group of conductive balls in the area, and moving the area so that parts of the path taken by the area overlap. In addition, by moving the area in this way to cover the surface of the mask, the apertures in the mask are filled with the conductive balls. That is, one aspect of the present invention is a method of mounting conductive balls comprising: a step of setting, on a substrate, a mask that includes a plurality of apertures for disposing conductive balls on the substrate; and a filling step that includes using a head that moves along a surface of the mask, holding a group of conductive balls in an area that is part of the surface of the mask, and moving the area so that parts of a path taken by the area overlap. Another aspect of the present invention is a filling device for filling conductive balls, after setting a mask on a substrate, in a plurality of apertures in the mask for disposing conductive balls on the substrate, the device comprising: a head for holding a group of conductive balls in an area that is part of a surface of the mask; and a head supporting means for supporting the head so as to move along the surface of the mask. In addition, another aspect of the present invention is a mounting apparatus including the above filling device and a device for setting the mask on a substrate.

Here, moving the head and area across or along the surface of the mask means changing the positions of the head and the area relative to the substrate on which the mask is set, and includes moving one or both of the head and the substrate. Here, "substrate" refers to the object onto which the conductive balls are to be mounted and includes a semiconductor wafer, a circuit board, a board used for transferring, and other types of work-piece. The path taken by the area shows the part or track passed when the area moves on the surface of the mask. Also, when the area passes, the openings or apertures in the parts of the mask corresponding to the track are filled with the conductive balls but there is no need to leave a clear trace on the surface or the like of the mask to show that the area has passed.

According to the present invention, the conductive balls are not simply moved on the mask but move in a state where the conductive balls are held in a limited area. By doing so, the conductive balls are prevented from freely spreading out on the surface of the mask and the range in which the group of conductive balls is present is limited. Accordingly, the density of the conductive balls in the area can be raised using a comparatively small number of conductive balls and the apertures in the parts of the mask passed by the area can be efficiently filled with the conductive balls. For this reason, it is possible to reduce the occurrence of unfilled apertures. Also, by moving the area with a high filling ratio so that parts of the path taken by the area overlap, it is possible to cover the entire surface of the mask without omissions, and therefore the rate of failure of filling into the apertures can be made extremely small.

Also, in the present invention, the number of conductive balls that should be held in the area that is limited region on the mask is extremely low compared to the amount of that required for trying to fill the apertures in the entire mask at once. Accordingly, the number of conductive balls that may be damaged due to movement on the mask is reduced and therefore the amount of conductive balls lost during a filling operation is reduced.

With a squeegee that merely moves back and forth on a mask, the squeegee will move with the same region being completely overlapped, and therefore aside from the first pass of the squeegee, the subsequent movements of the squeegee will fill only the apertures that have been failed of filling with balls. Accordingly, when back and forth movement is carried out, aside from the first or first few passes, repeatedly moving the balls with the squeegee for attempting to reduce the number of unfilled apertures will damage the balls and lead to many balls being lost.

In the present invention, an area with a high filling ratio is moved so that the path taken by the area partially overlaps, and therefore the entire surface of the mask is covered without omissions. Accordingly, by moving the area, new apertures to be filled appear. By providing a means for supplying the conductive balls inside the area and adding an amount of conductive balls corresponding to the conductive balls consumed for filling as the area moves, it is possible to keep the conductive balls held inside the area in a fresh condition. The lifetime (the time taken for conductive balls to be consumed) from the supplying of new conductive balls to the area to the filling of the apertures in the mask, i.e., the disposing of the conductive balls at predetermined positions on the substrate can be reduced, and therefore fluctuations in the lifetimes of the conductive balls that last until the conductive balls fill the openings of the mask can be reduced. This means that according to the present invention, it is possible to dispose conductive balls with uniformly high quality at predetermined positions on the substrate and therefore the yield of mounting the conductive balls on a substrate can be improved.

To have the path taken by the area or head partially overlap and thereby cover the entire surface of the mask, moving of the area includes moving tracing a zigzag or a sine curve pattern. Moving the area in a spiral or whirl pattern is also preferable. By having adjacent parts of the path overlap by 50% or more, the surface of the mask can be covered by the area ultimately with an overlapping ratio of 100% or higher. On the other hand, if the overlapping ratio of the adjacent parts of the path is too high, the number of balls that fill apertures as the area moves falls, the lifetimes of the conductive balls become longer, and the probability of the balls becoming damaged increases. Accordingly, the overlapping ratio for the path should preferably be around 50% to improve the probability of filling the apertures in the mask with conductive balls of high quality.

To prevent the quality of the balls from deteriorating due to interference between the conductive balls and the mask having apertures and other reasons, the conductive balls should preferably fill the apertures in the mask by dropping due to gravity, that is, under their own weight. When the conductive balls are continuously pushed in one direction, due to a large number of balls gathering, the balls interfere with one another, resulting in the possibility of the balls not falling into the apertures. In addition, it is not preferable to forcibly push the balls in such state into the apertures using a squeegee. In the present invention, by holding the conductive balls in the area, it is possible to move the area in a freely chosen direction. In addition, by appropriately changing the direction of movement of the area, it is possible to prevent the conductive balls from becoming distributed extremely unevenly inside the area. Accordingly, it is possible to encourage the conductive balls to fill the apertures under their own weight.

One method of holding the conductive balls in the area is to surround the area so that the balls cannot escape from the area. However, efforts to surround the area so that no balls can escape from the area have a number of problems. For example, it is necessary to apply pressure so that a means for moving the balls, such as a squeegee, is completely in tight contact with the surface of the mask, but by doing so, there is the possibility of the balls that have filled apertures jumping out and/or of the mask being damaged. Also, should a ball somehow escape from the area, the ball will remain on the mask and become a stray ball, such balls causes erroneous mounting at an unexpected position on the substrate.

In the present invention, by gathering the conductive balls from around the area toward the area using the head, a group of conductive balls is held in the area. That is, one aspect of the present invention is a method of mounting including: setting on a substrate, a mask that includes a plurality of apertures for disposing conductive balls on the substrate; and a filling step that includes using a head that is movable along a surface of the mask, gathering conductive balls into an area that is part of the surface of the mask from around the area, and moving the area. Another aspect of the present invention is a filling device that includes a head for holding a group of conductive balls in an area that is part of a surface of a mask; and head supporting means for supporting the head so as to move across the surface of the mask.

A circle and a polygon that circumscribes a circle are examples of shapes for the area where the conductive balls can be easily gathered toward the area regardless of the direction in which the area is moving. For example, it is possible to vibrate or oscillate the head so that the conductive balls in the round or surrounding of the area are swept together toward the area. Also, by blowing out gas such as air from the head toward the area for filling the balls, it is possible to sweep the conductive balls together. One preferred method for gathering the conductive balls is rotating the head to move the conductive balls toward an area in the center of the head and thereby gather the conductive balls. By causing the head to rotate about an axis of a shaft that is perpendicular to the mask and moving the perpendicular shaft (axis) across the surface of the mask to gather the conductive balls in the area by rotating the head, it is possible to move a group of conductive balls while keeping the conductive balls in the area.

The head supporting means of the filling device included in the present invention should preferably include a means for rotating the head about a shaft that is perpendicular to the mask and a means for moving the perpendicular shaft across the surface of the mask. The head should also preferably include a means that gathers the conductive balls by rotating the head to move the conductive balls toward a concentric circular area (inner circle) around the center of rotation of the head. If the means that gathers the conductive balls is a magnetic body or an electret body (a charged body), a repulsive force of the means may be used. One preferable means for gathering is a sweeper for sweeping the surface around the circular area using one or more members that protrude from the head or by blowing out gas. The sweeper needs to be disposed or shaped so that the conductive balls are moved toward the area. Examples are a shape that is curved in a part of spiral, a shape that is oriented toward the center of the rotation with respect to the radial direction, and the like.

One type of member that protrudes from the head is called a squeegee that achieves a sweeping effect for the surface of the mask. One example has squeegee with a simple linear shape extend tangentially from the circular area in which the conductive balls are gathered, and by rotating a head including a plurality of such squeegees, it is possible to apply a force in a direction of a circular area to the conductive balls in around or surroundings of the circular area. In addition, by disposing the plurality of squeegees so as to overlap in the direction of movement thereof, that is, the direction of the movement due to the rotation of the head, conductive balls that have escaped from other squeegees can be caught and reliably gathered toward the circular area.

To gather the conductive balls from the around the area, members that protrude from the head or gas blown out from the head also function so as to press the mask in the periphery of the area onto the substrate. When the substrate on which the conductive balls are mounted is the wafer of a semiconductor device or a work (work-piece), the tendency for substrates to be increasingly large means that the mask also becomes large. On the other hand, there is a tendency for the conductive balls to become smaller as the integration of devices progresses, and examples of the conductive balls are solder balls, gold balls, or copper balls with a diameter of around 30 to 300 μm. Accordingly, when mounting balls on the substrate, it is important to minimize the effect of the gaps produced between the substrate and the mask due to warping and bending of the mask. Although it is comparatively easy to correct the surface profile irregularity of the substrate by attaching the substrate from the rear side thereof using suction, the mask cannot be reinforced from the front or rear and therefore it is difficult to correct the profile irregularity of the mask. In particular, when the mask is large, it is difficult to prevent warping and bending, and therefore if the balls have a small diameter, there will be the possibility of the balls getting into minute gaps and becoming stray balls. In addition, although in order to place the conductive balls, the mask should preferably be tightly attached to a substrate, there are cases where flux for mechanically and electrically connecting the balls is printed on the substrate, and when this is the case, it may not be preferable to tightly attach the mask to a substrate.

According to the present invention, instead of improving the flatness or correcting profile irregularity of the entire mask, the flatness of part of the surface of the mask is improved by pressing the around or periphery of the area. By doing so, since it is possible to improve the flatness inside the limited area for filling the conductive balls, it is possible to prevent the occurrence of stray balls from the outset. Also, by holding the conductive balls gathered together inside the area, it is possible to prevent the occurrence of stray balls even if there are gaps in other regions of the mask. Accordingly, one aspect of mask used by the mounting apparatus and mounting method in the present invention is a mask that is flexible so that the mask can be made flatter by being pressed by members that protrude from the head or by gas blown out from the head.

BEST MODE FOR CARRYING OUT THE INVENTION

Figure 1:
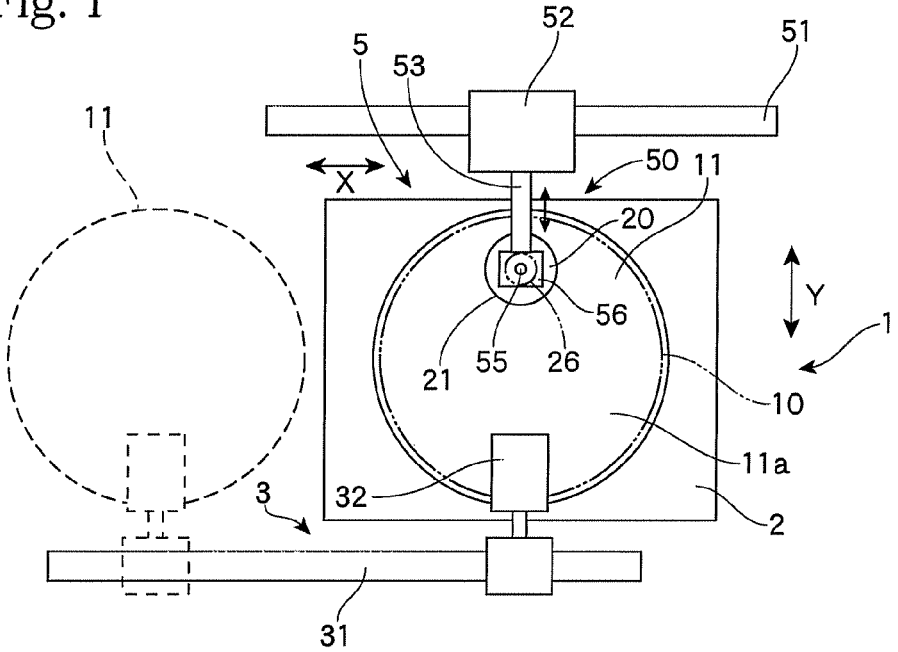
FIG. 1 is a plan view schematically showing a general arrangement of a ball mounter according to the present invention.

FIG. 1 shows the general arrangement of a mounting apparatus of one example the present invention. This mounting apparatus 1 is called a ball mounter and disposes conductive balls at predetermined positions on a semiconductor substrate (wafer or work-piece) 10. Almost present wafers 10 are around eight inches or twelve inches in diameter. The conductive balls mounted on the substrate 10 are refined so that the diameter is 1 mm or below. The mounting of balls with a diameter of around 10 to 500 μm is being investigated, with present demand being for the mounting of balls with a diameter of around 30 to 300 μm. Here, "conductive balls" includes solder balls, metal balls made of gold, silver, or the like, and also ceramic balls or plastic balls that have been subjected to a process such as plating with a conductive material.

The ball mounter 1 includes a table 2 for setting the substrate 10 in a horizontal state where warping is corrected by a method such as attachment by suction, a mask handler (mask carrier) 3 for setting a mask 11, which includes a plurality of apertures or openings for disposing the conductive balls at predetermined positions on the substrate 10, on the substrate 10, and a filling device 5 for filling the apertures in the mask 11 with the conductive balls. The mask handler 3 includes a conveying unit 31 for moving the mask 11 between a position above the substrate 10 and a withdrawal position shown by the broken line and an alignment unit 32 for aligning the substrate 10 and the mask 11. The device for setting the mask 11 on the substrate 10 may fix the position of the mask 11 and move the substrate 10 up and down and/or in the horizontal direction to align the mask 11 and the substrate 10.

The mask 11 includes a plurality of apertures of a size that is suited to inserting single conductive balls that are minute. The substrate 10 normally includes a plurality of semiconductor devices and the plurality of apertures in the mask 11 are formed with a repetitive design according to rules for disposing conductive balls at predetermined positions of such semiconductor devices. Such openings provided in the mask 11 are referred to as apertures, pattern holes, a hole pattern or an opening pattern, and the like, and in the present specification, when referring to a plurality of apertures, the expression "opening pattern" is used.

The filling device 5 includes a head 20 that moves across or along a surface 11a of the mask 11 set on the substrate 10 to fill the apertures of the mask 11 with the conductive balls and a head supporting device 50 for supporting the head so as to move in a freely chosen direction on the surface 11a of the mask 11. The head supporting device 50 includes a motor 56 that support the head so as to rotate about an axis (shaft) 55 that is perpendicular to the mask 11 and a carriage 52 that supports the motor 56 via an arm 53 that is retractable in the Y direction. The carriage 52 moves along a carriage shaft 51 in the X direction. Accordingly, the head 20 can be set at a freely chosen position in the X-Y direction on the surface 11a of the mask 11 by the arm 53, the carriage 52, and the carriage shaft 51 of the supporting device 50. Also, the head 20 can be moved by the supporting device 50 so as to trace a desired path across the surface 11a of the mask 11.

The mounting apparatus 1 includes a step of setting the mask 11, which includes the plurality of apertures 12 for arranging the conductive balls, on the substrate 10 and a filling step process for filling the apertures 12 of the mask 11 with the conductive balls using the head 20 that moves along the surface 11a of the mask 11, and thereby disposes the conductive balls at predetermined positions on the substrate 10. This filling step of process will now be described in more detail while describing the details of the filling device and its operation.

Figure 2:
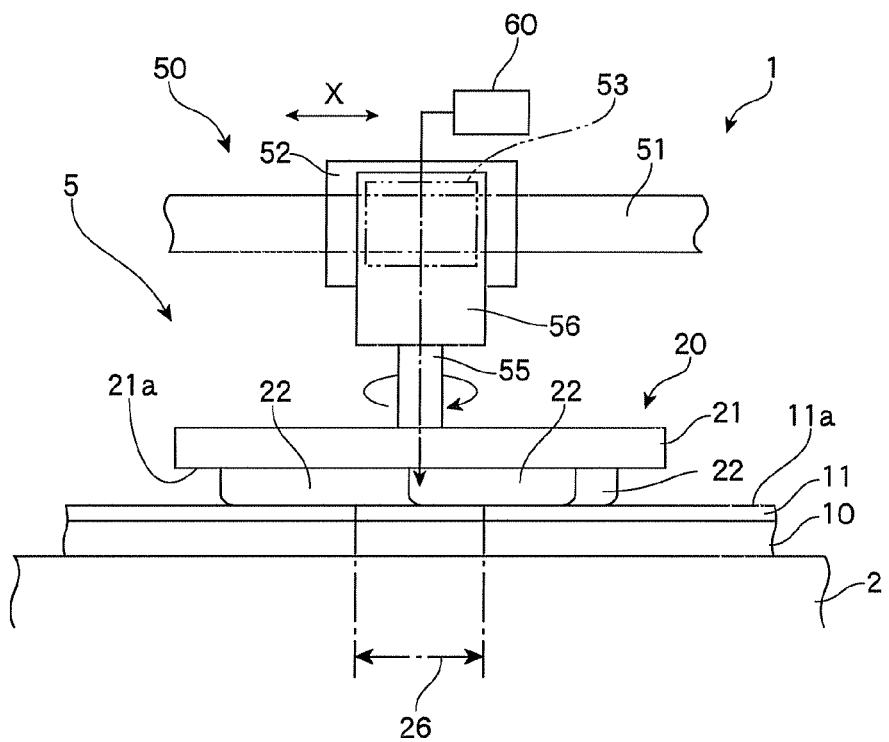
FIG. 2 is a side view schematically showing details of a head.

FIG. 2 shows an enlargement of the head 20 of the filling device 5 when looking from the side. The head 20 includes a disc-shaped squeegee support 21 and six sets of squeegees 22 that protrude toward the surface 11a of the mask 11 from a lower surface 21a of the squeegee support 21. The center of the squeegee support 21 is connected to the shaft 55 that extends perpendicular to the mask 11. The head 20 is rotated about the axis of the shaft 55 by the motor 56 in a clockwise direction when looking from above the squeegee support 21.

The motor 56 is a means that rotates the squeegee support 21 about the shaft 55 on the surface 11a of the mask 11, and the shaft 55 is moved in a desired direction on the X-Y plane across the surface 11a of the mask 11 by the arm 53, the carriage 52, and the carriage shaft 51. Accordingly, by using the head supporting device 50, the head 20 can be moved so as to trace a desired path on the surface 11a of the mask 11 while the head 20 is being rotated. A ball supplying device 60, which supplies conductive balls via an inside of the shaft 55 onto the mask 11 from the center of the squeegee support 21, is mounted on the carriage 52.

Figure 3:
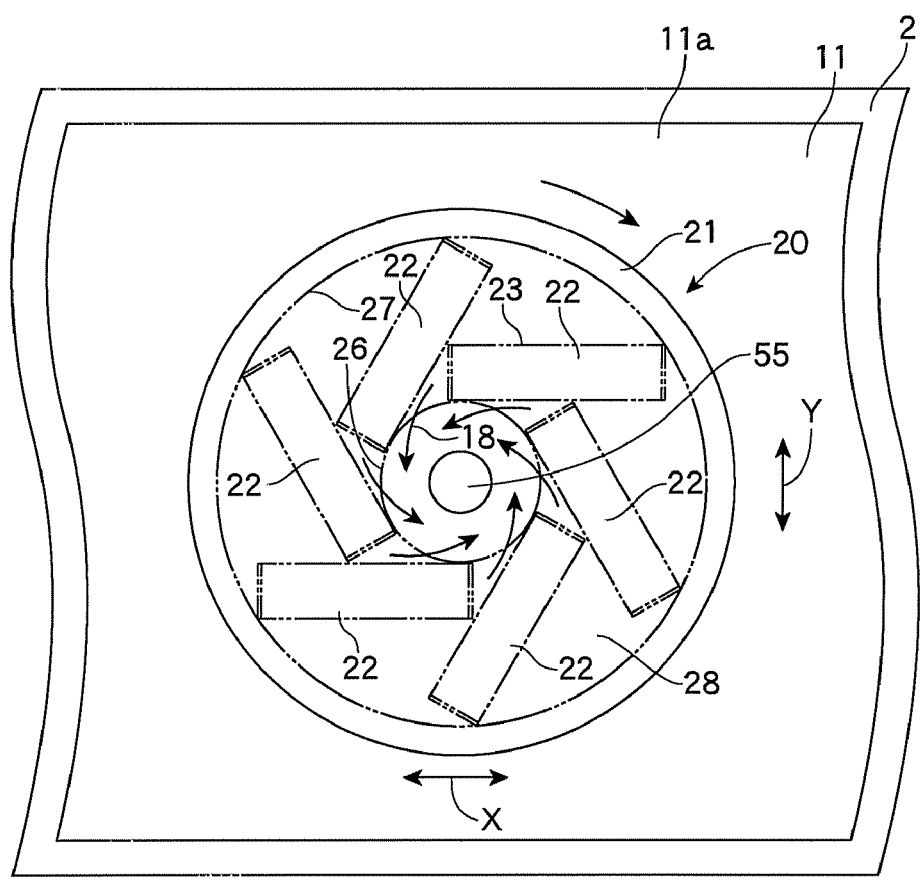
FIG. 3 is a view showing details of the head when looking through the head from above.
Figure 4:
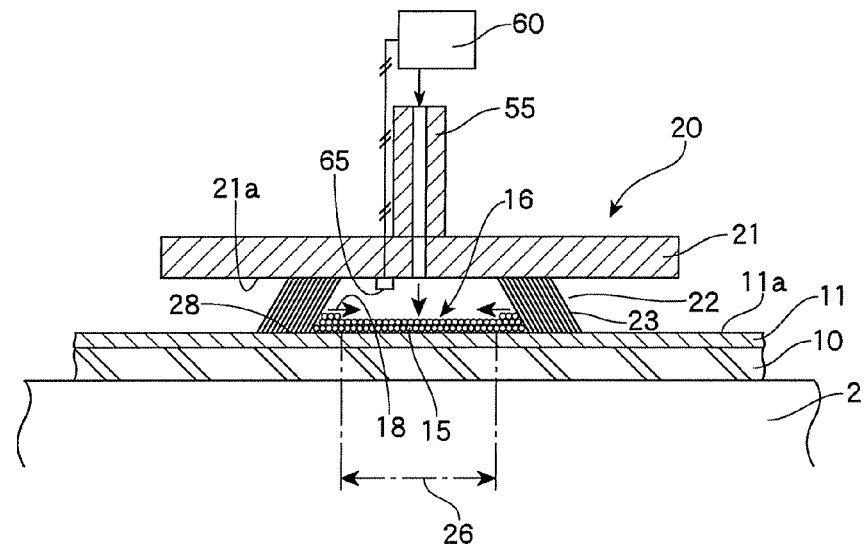
FIG. 4 is a cross-sectional view showing details of the head.

FIG. 3 shows a state where the arrangement of the six sets of squeegees 22 attached to the lower surface of the squeegee support 21 are viewed from above looking through the squeegee support 21. FIG. 4 shows the construction of the head 20 via a cross-section where the head 20 is cut in a diameter direction for the squeegee support 21. The six sets of squeegees 22 include a plurality of sweep members 23 attached so as to be rectangular when respectively viewed from above. The sweep members 23 may be any members that contact the surface 11a of the mask 11 comparatively softly and can sweep together the conductive balls 15 remaining on the surface 11a. Wires that are bent so as to contact the surface 11a of the mask 11, elastic members such as rubber plates or sponges shaped so as to contact the surface 11a of the mask 11, and a large number of wires that extend far enough to contact the surface 11a of the mask 11 can be given as examples of the sweep members 23.

The squeegees 22 are arranged with a uniform pitch in the circumferential direction around an inner circle 26 that is concentric with the rotational shaft 55 and linearly extend tangentially in a clockwise direction from the inner circle 26 toward an outer circle 27. Accordingly, in a state where the squeegees 22 contact the surface 11a of the mask 11, when the squeegee support 21 is rotated in the clockwise direction when looking from above, the conductive balls 15 present in the movement direction (rotation direction) of the squeegees 22 are pushed and swept toward the inner circle 26, as shown by the arrows 18. This means that the conductive balls 15 remaining on the surface 11a of the mask 11 are moved toward the inner circle 26 and gathered inside the inner circle 26.

In FIG. 3 and the subsequent drawings, areas defined with the inner circle 26 and the outer circle 27 are virtual areas. However, when the head 20 moves on the surface 11a of the mask 11 while being rotated by the head supporting device 50, the excess conductive balls 15 remaining on the mask 11 in the area between the inner circle 26 and the outer circle 27 are gathered in the direction of the area in the inner circle 26 located on the center of the head 20. Since the plurality of squeegees 22 are arranged so as to overlap in the direction of rotation (the direction of movement), by moving the head 20, the conductive balls 15 that are outside the range of the inner circle 26 are successively gathered in the direction of the inner circle 26 when the inner circle 26 is moved. Accordingly, the conductive balls 15 are held in a circular area 26 around the center of rotation of the head 20, the circular area 26 moves together with the movement of the head 20, and therefore a group 16 of the plurality of conductive balls 15 held inside the head 20 also moves. In this way, in the filling device 5, the virtual circular area 26 in the center of the head 20 is part of the area 26 of the surface 11a of the mask 11 where the group 16 of conductive balls 15 is held, with the area 26 moving due to the movement of the head 20.

Figure 5:
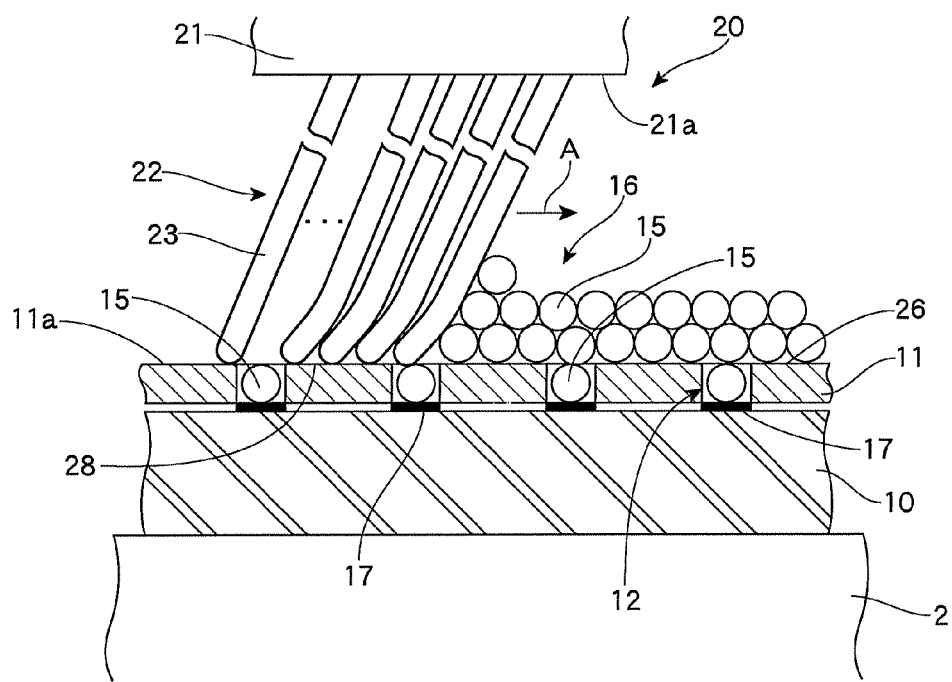
FIG. 5 is an enlarged view of a squeegee.

In FIG. 5, the state where the front ends of the squeegees 22 contact the surface 11a of the mask 11 is shown by an enlargement. The respective squeegees 22 include a plurality of sweep members 23 which are disposed so as to multiple in a direction of movement of the squeegees 22. The plurality of sweep members 23 are attached to the squeegee support 21 so that the front ends that contact the surface 11a of the mask are bent backward with respect to the direction of movement of the squeegees 22. The sweep members 23 move so as to lightly press or sweep the conductive balls on the mask 11 towards the circular area 26 that is the direction of movement A. For this reason, a group 16 of conductive balls 15 is formed and held in the circular area 26 inside the head 20. The balls 15 gathered in the area 26 fall under their own weight into the apertures 12 of the mask 11 in the area 26 to fill the apertures 12 with the balls 15. Flux 17 for soldering purposes is screen-printed in advance on the surface of the substrate 10 corresponding to the opening pattern 12 of the mask 11. Accordingly, the conductive balls 15 filled in the apertures 12 are tightly attached to the flux 17 to temporarily fix the conductive balls 15 at predetermined positions on the substrate 10. The substrate 10 on which the conductive balls 15 have been mounted is thereafter subjected to a well-known reflow process to fix the balls 15 to the substrate 10.

By the filling device 5, balls 15 are always gathered to the limited area referred to as the circular area 26 for filling the apertures. Accordingly, by monitoring the state of the conductive balls 15 gathered in the area 26, it is possible to control the condition of filling the apertures 12 of the mask 11 with the balls 15. For example, the conductive balls 15 held in the area 26 are consumed by filling the apertures 2. Then, balls 15 are introduced inside the area 26 from the ball supplying device 60 based on the number of balls that have been consumed. Balls 15 may be supplied at intervals of a predetermined time based on the number of balls consumed per unit time (hour). Accordingly, the density of the group 16 of conductive balls 15 in the area 26 is maintained and a fall in the probability of the apertures 12 being filled due to a fall in the ball density is avoided. The head 20 shown in FIG. 4 includes an optical sensor 65 that detects the density of the balls 15 in the area 26, and regardless of whether balls are being supplied at intervals of a predetermined time, should the ball density of the area 26 fall for whatever reason, new conductive balls 15 are supplied to the area 26 from the ball supplying device 60 mounted on the carriage 52. It is also possible to provide a mechanism for periodically renewing the balls 15. If a state where the balls are moved without being inserted into the apertures 12 in the mask 11 continues for a long time, the balls 15 would be damaged by factors such as contact and abrasion. In this system following process may be applied that collecting the balls 15 held in the area 26, discarding the balls whose quality has deteriorated, and returning only proper balls 15 to the area 26 for filling.

An appropriate size for the area 26 for holding and moving the balls 15 will change depending on conditions such as the diameter of the conductive balls and the density of the apertures in the mask 11. If the diameter of the conductive balls 15 is around 10 to 500 μm, a head 20 that can form the area 26 with a diameter of 10 to 100 mm on the mask is preferable. If the area 26 for holding the balls is too small, the time required to fill the openings in the entire mask is increased. Accordingly, the diameter of the area 26 should preferably be at least 10 mm. On the other hand, if the area 26 is too large, the movement of the balls 15 inside the area 26 will be insufficient, resulting in increased unevenness in the density of the balls held inside the area 26. Accordingly, the diameter of the area 26 should preferably be no greater than 100 mm. More preferably, the circular area 26 should be 20 to 60 mm, inclusive.

If the rotational speed of the head 20 is too low, the movement of the balls 15 inside the area 26 will be insufficient, resulting in increased probability of the conductive balls 15 failing to fill the apertures 12. Accordingly, the rotational speed of the head 20 should be at least 10 rpm. On the other hand, if the rotational speed is too high, the movement speed of the conductive balls 15 will become fast, resulting in increased probability of the balls 15 passing the apertures 12 without falling thereinto and increased probability of the conductive balls 15 failing to fill the apertures 12. Accordingly, the rotational speed of the head 20 should be no greater than 120 rpm. A more preferable range for the rotational speed of the head is 30 to 90 rpm. For example, in the filling device 5 according to the present embodiment, the diameter of the circular area 26 formed by the head 20 in which the balls gather is 40 mm and the rotational speed is 45 rpm.

Figure 6:
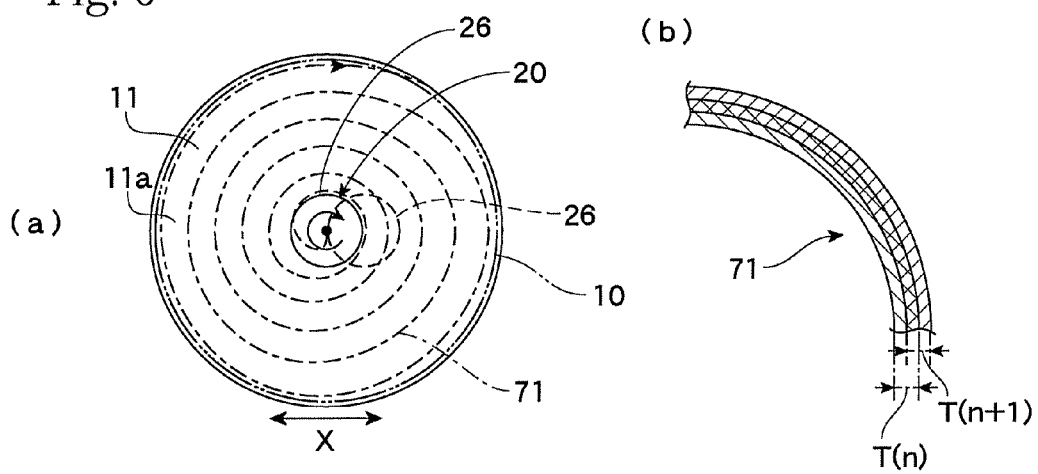
FIG. 6(a) is a diagram showing one example of a path taken by a circular area by the head.
FIG. 6(b) is an enlarged view of part of the path.
Figure 7:
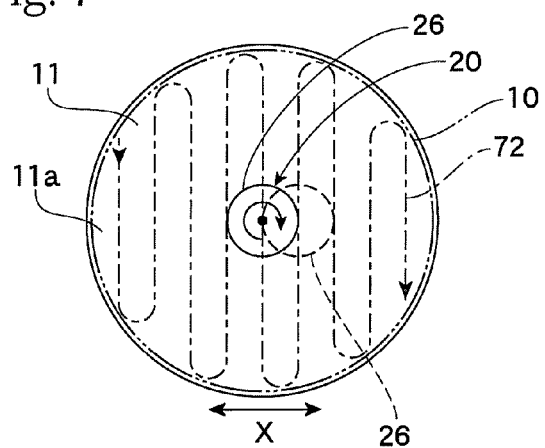
FIG. 7 is a diagram showing another example of a path taken by a circular area by the head.
Figure 8:
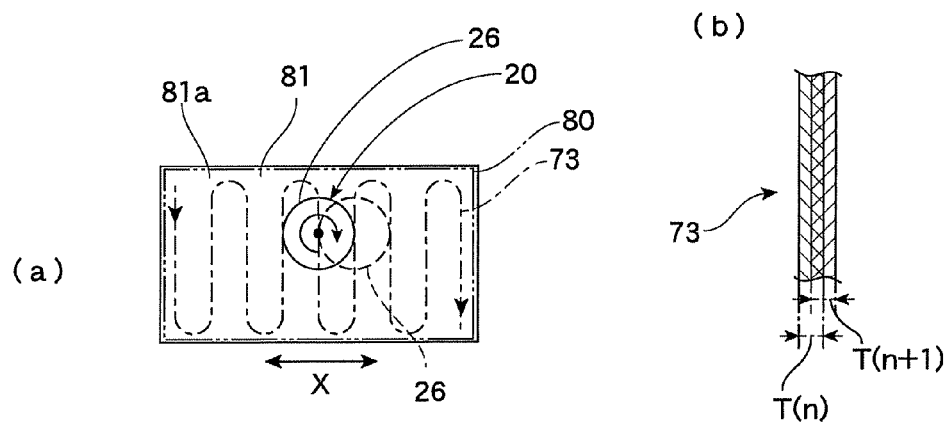
FIG. 8(a) is a diagram showing another example of a path taken by a circular area by the head.
FIG. 8(b) is an enlarged view of part of the path.
Figure 9:
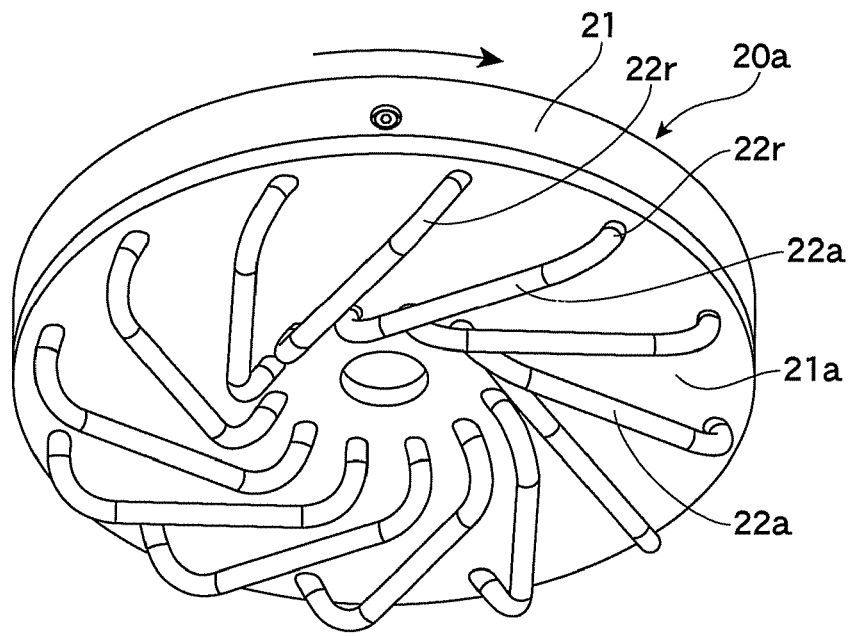
FIG. 9(a) is a perspective view showing a different example of a head.
FIG. 9(b) is a view showing the head when looking through the head from above.
Figure 9:
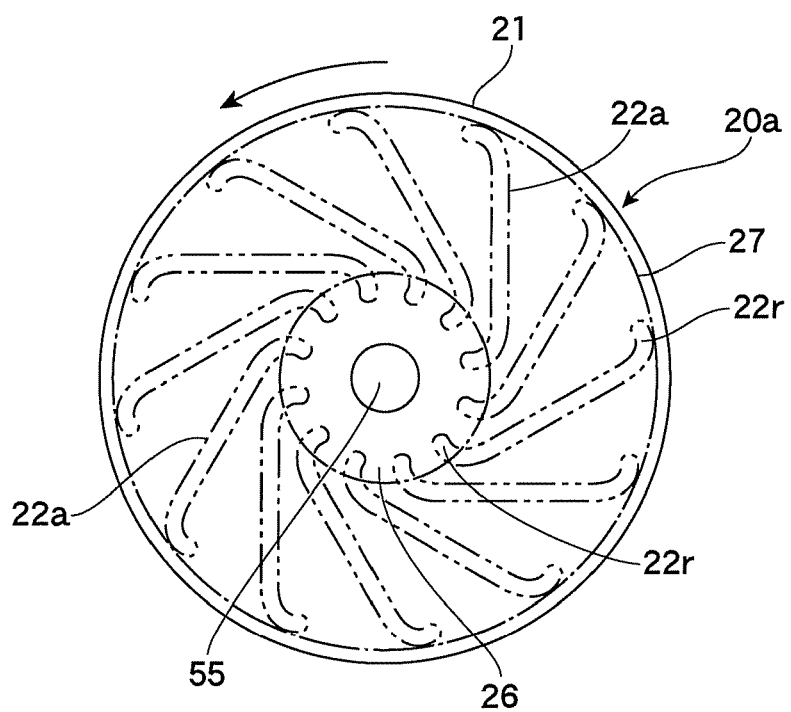
Figure 10:
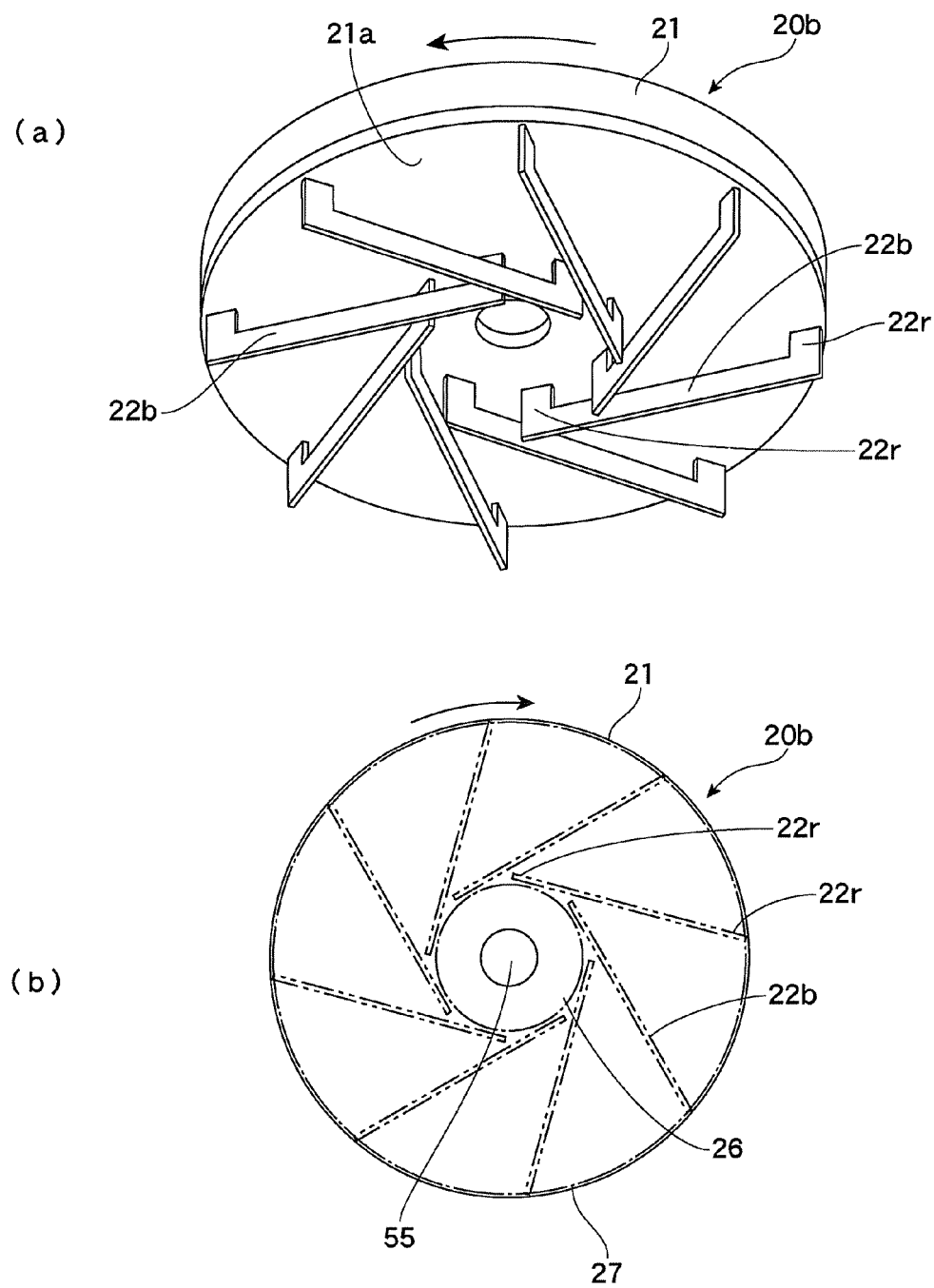
FIG. 10(a) is a perspective view showing yet another example of a head.
FIG. 10(b) is a view showing the head when looking through the head from above.
Figure 11:
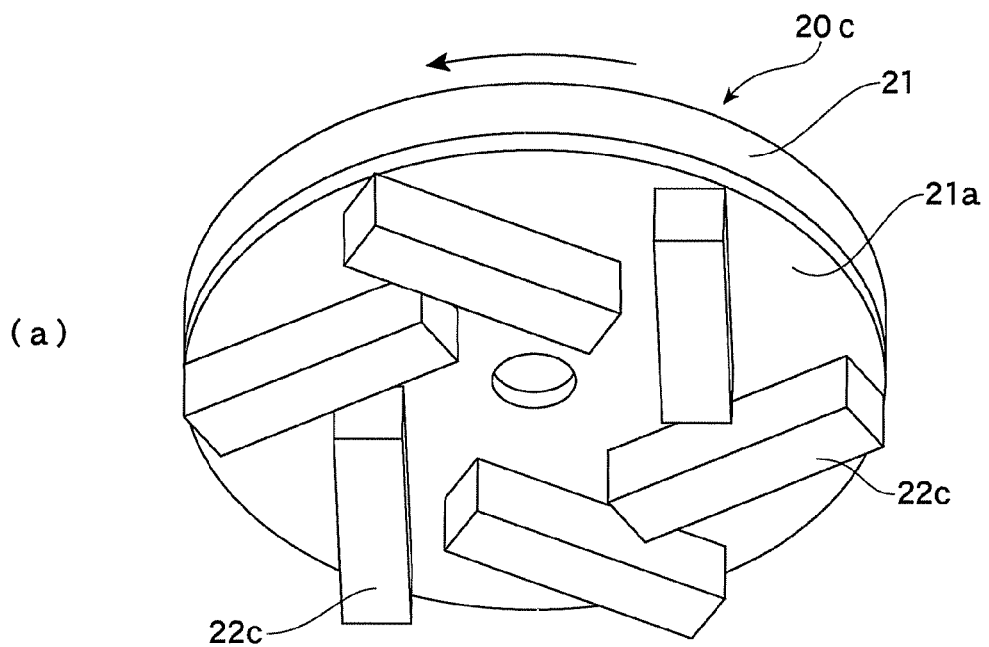
FIG. 11(a) is a perspective view showing yet another example of a head.
FIG. 11(b) is a view showing the head when looking through the head from above.
Figure 11:
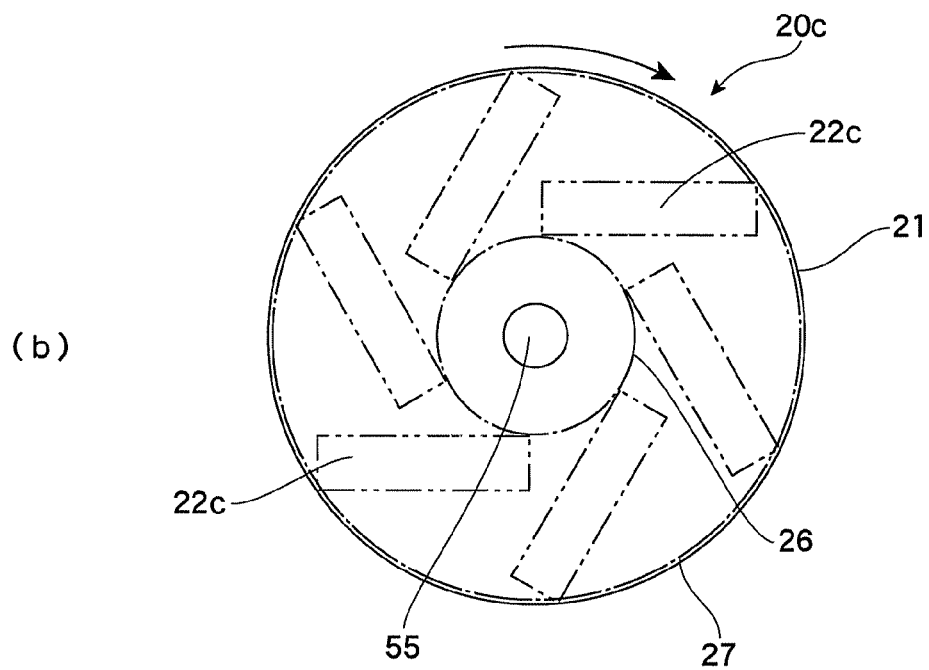

FIGS. 6 to 8 show a number of examples of paths for moving the circular area 26 so as to cover the surface 11a of the mask 11. When the surface 11a of the mask 11 is an XY plane, the head supporting device 50 of the filling device 5 can move the head 20 in a freely chosen direction on the XY plane. The direction of movement of the head 20 can also be freely and dynamically changed. In addition, the head 20 can gather and hold the conductive balls 15 in the circular area 26 by rotating regardless of the direction of movement of the head 20. For this reason, in a state where the conductive balls 15 are held in the circular area 26, the filling device 5 can move the area 26 in a freely chosen direction on the surface 11a of the mask 11, with it being possible to freely and dynamically change the direction of movement.

FIG. 6(a) schematically shows an example where the head 20 is moved to trace a spiral or whirl-like path on the surface 11a of the mask 11. By moving the head 20, the circular area 26 for filling the balls 15 moves across the entire surface of the mask 11 in a spiral or whirl-like path 71 to dispose the conductive balls 15 at predetermined positions on the substrate 10. The spiral or whirl-like path 71 is suited to cases where the substrate 10 is circular, the mask 11 is circular, and/or the entire region to be filled with the conductive balls 15 is circular.

It should be noted that in FIG. 6(a), the path 71 on which the area 26 moves is shown by a line representing the path on which the center of rotation moves. For ease of understanding, the head 20 and the area 26 are shown by the same circle, but as described above the area 26 is actually formed concentrically with the head 20 and is not the same size. However, since the area 26 is constructed so as to be concentric with the head 20, the path traced by the center during movement is the same. Also, in the present specification, the "path taken by the area 26" does not represent the movement of the center but represents a wide path, track or route indicating how the area 26 moves over the surface 11a of the mask 11. Also, even if the path taken by the area 26 can be said to be a path on which the apertures 12 of the mask are physically filled by the conductive balls 15, the path does not need to leave a trace on the surface 11a of the mask 11. As one specific example relating to the path taken by the area 26, in the head supporting device 50 of the filling device 5, the detail profile of the path can be provided by a program or function for automatically moving the head 20.

FIG. 6(b) shows an enlargement of part of the path 71. To cover the entire surface 11a of the mask 11 with the area 26 without omissions, the head 20 is moved by the head supporting device 50 of the filling device 5 so that parts of the path taken by the area 26 overlap. In this example, the path 71 is selected so that adjacent parts T(n) and T(n+1) of the path 71 overlap by almost 50%. By moving the head 20 on this path 71, the area 26 can move so as to overlap 100% of the entire surface of the mask 11 and fill the apertures 12 of the mask 11 with the balls 15.

FIG. 7 shows a different example of the path taken by the head 20 and the circular area 26. In this example, by moving the head 20, the area 26 moves so as to trace a "zigzag", "sine curve", or "snaking" path 72 so that the area 26 covers the entire surface 11a of the mask 11. When the path 72 is used, in the same way as described above, the overlapping rate of adjacent parts of the path 72 should preferably be set appropriately.

FIG. 8(a) shows an example where the conductive balls 15 are disposed by setting a mask 81 with an overall rectangular filling region on a rectangular electronic circuit board 80 in place of the circular substrate 10. In this example, by moving the head 20, the area 26 moves so as to trace a "zigzag", "sine curve", or "snaking" path 73, with the area 26 covering the entire surface 81a of the mask 81. As shown in FIG. 8(b), when the path 73 is used, the adjacent parts T(n) and T(n+1) of the path 73 should preferably overlap by around 50%. The zigzag path 73 is one example of a path that is suited to covering a quadrangular filling region. A spiral path that traces a route along the outer circumference of a quadrangle is another path that is suited to covering a quadrangular filling region.

To fill the opening pattern 12 of the mask 11 without omissions, the area 26 should preferably move with a high overlapping rate. On the other hand, if the overlapping rate of the path is high, the processing time require to dispose the balls 15 on the entire substrate 10 increases. Also, if the overlapping rate of the path is high, there is a fall in the consumed number of balls 15, and since the balls are present in the area 26 for a long time, the probability of the balls being damaged increases. For this reason, the area 26 should preferably move so as to trace a path with the rate of overlapping in a range of 10 to 90% inclusive. The area 26 should more preferably move so as to trace a path with the rate of overlapping in a range of 30 to 70% inclusive. A path with a rate of overlapping of 50% is one example of an optimal path for moving the area 26.

If the movement speed of the head 20 is too slow, too much time will be taken to dispose the balls 15 on the entire substrate 10. On the other hand, if the movement speed of the head 20 is too fast, the probability of the area 26 moving on before the balls 15 have fallen into the openings 12 increases. Accordingly, the movement speed of the head 20 should preferably fall in a range of 2 to 60 mm/s, with a speed in a range of 5 to 40 mm/s being more preferable. For the filling device 5 of the present embodiment, the movement speed of the head 20 is set at 20 mm/s.

In this way, in the filling device 5 used in the ball mounter 1, the conductive balls 15 are held in a limited part, that is, the circular area 26 of the head 20, out of the surface 11a of the mask 11. Also, by moving the head 20, the area 26 moves across or along the surface 11a of the mask with parts of the path 51 taken by the area 26 overlapping to fill the apertures 12 of the mask 11 with the conductive balls 15, thereby disposing the balls 15 at predetermined positions on the substrate 10 that is the work-piece. In the filling device 5, since the balls that do not fill the apertures do not move away from the mask but balls are gathered on the mask to fill the next apertures, waste is prevented for the conductive balls 15. Accordingly, unlike a method where the apertures 12 are filled with the balls 15 by sweeping and removing the entire surface of the mask 11 at a time with a squeegee, the limited area can be covered by a group 16 of the balls 15 that is sufficient (sufficiently excessive) with respect to the apertures (opening density) of the area to be filled without supplying an extremely large number of balls at a time. That is, in the small area 26 that is part of the surface of the mask, by gathering an excessive number of balls in the around or surrounding of the area and adding the consumed balls, a sufficient rate of excess is maintained for the conductive balls 15 with respect to the apertures 12 in the area 26. By using this method, the rate of loss for the balls is low relative to the number of apertures 12 in the entire mask, thereby preventing waste for the balls 15 and achieving a high fill ratio.

Also, by moving the area 26 used for filling so that parts of the path overlap, it is possible to constantly supply new balls 15 as the area 26 moves. Accordingly, the time (referred to as "lifetime" in the present specification) from the supplying of the new balls 15 to the disposing of such balls on the substrate 10 can be reduced, and the lifetimes of the conductive balls 15 disposed on the substrate 10 can be made fairly uniform. Accordingly, likely to the as-produced conditions of the conductive balls 15 disposed on the substrate 10 can be kept uniformly high and conductive balls 15 with little damage can be disposed on the entire substrate.

In addition, by rotating the squeegee support 21, the head 20 of the filling device 5 can gather the conductive balls 15 in the internal circular area 26 without being affected by the direction of movement of the head 20. Accordingly, the function (ability) of the head 20 to gather the balls in the inner circular area 26 does not change regardless of the direction of movement of the head 20 in the X-Y plane on the mask 11. This means that while the head 20 is moving, the excess balls 15 on the mask 11 in the area around the inner circular area 26 can be constantly gathered into the area 26. In addition, the overall distribution of balls 15 in the inner circular area 26 becomes substantially uniform, unevenly clustered balls in one part of the inner circular area 26 becomes substantially lower, and the entire area 26 that extends in two dimensions can be useable to fill the opening pattern 12 with the conductive balls 15. Too much excessive gathering of balls 15 inside the area 26 does not occur, and the excess rate and distribution of the conductive balls 15 become substantially constant without becoming excessively unbalanced. For this reason, by moving the area 26 so that parts of the path overlap, it is possible to reliably reduce the number of unfilled apertures without overlapping the entire movement path.

A head 20 that applies a force to move the conductive balls 15 toward the area 26 by rotating is one of the most preferred embodiments of the present invention. As another example of the method of gathering the conductive balls 15 toward the area 26, it is possible to vibrate or oscillate the head to sweep together the balls in the direction of the area 26 using the squeegees attached to the bottom of the head. In this method, depending on the direction and number of vibrations and the shape of the squeegees, the shape of the area 26 is not limited to a circle and may be a polygon that circumscribes a circle. When the area 26 is shaped as a polygon, the performance for gathering the balls 15 may differ according to the direction of movement of the head. Therefore, a circular area 26 is superior in that the direction of movement of the head 20 can be selected without the performance for gathering and holding the balls 15 rising or falling according to the direction of movement of the head 20.

The squeegees 22 of the head 20 of the filling device 5 collect the balls 15 from around the area 26 used for filling and also have a function (ability) for flattening a part of the mask 11 corresponding to the area 26 used for filling by pressing. As shown in FIG. 3, the squeegees 22 are arranged between the inner circle 26 and the outer circle 27 of the head 20, that is, in the surroundings (the area around) 28 of the circular area 26. The front ends of the squeegees 22 are pressed with suitable pressure onto the surface 11a of the mask 11 to gather the balls 15 remaining on the surface 11a of the mask 11 without leaving any balls. Accordingly, even if the part of the mask 11 corresponding to the area 26 is warped or bent, by pressing the periphery 28 of the area 26 using the squeegees 22, it is possible to correct the part to a flat (horizontal) state.

To prevent multiple balls from filling the apertures, the mask 11 is a thin-plate-like member with substantially equal thickness to the balls 15. Accordingly, although the mask 11 is susceptible to warping and bending, by pressing the squeegees 22 onto the surface 11a with a suitable pressure, such warping and bending (distortion) can be corrected. When the mask 11 is warped or bent, gaps are produced between the substrate 10 and the mask 11. If the substrate 10 is held on the table 2 that is highly flat by a vacuum suction method, warping and bending can be corrected to make its surface flat. Accordingly, by correcting warping or bending of the part corresponding to the area 26 by pressing the surface 11a of the mask 11 with the squeegees 22, it is possible to prevent gaps being produced between the mask 11 and the substrate 10 and therefore balls 15 can be prevented from escaping via such gaps.

If the diameter of the balls to be mounted on the substrate is a few mm or larger, the mask will also be a few mm thick, resulting in the mask having higher strength. Accordingly, the mask will be resistant to warping and bending, contrary, should such warping and bending occur, it will not be easy to correct such warping with the amount of pressure that can be applied by the squeegees. Also, if the diameter of the balls is a few mm, no balls would not escape from the gap between the substrate and the mask if the gap can be adjusted in units of mm. However, if the diameter of the balls is in units of $\mu m$, it will be necessary to adjust the gap between the substrate and the mask in units of $\mu m$. Although it is preferable to tightly attach the entire mask 11 to the substrate 10 to prevent gaps from being produced between the mask 11 and the substrate 10, the flux 17 for fixing the balls 15 is printed on the substrate 10. Accordingly, tightly attaching the entire mask 11 to the substrate 10 cannot be said to be preferable.

When the squeegees move the balls in one direction or simply back and forth, it may be possible to correct warping and bending of the mask at a linear part of the mask where the squeegees are in contact. However, it will not be possible to correct the area part of the mask where the balls are present by pressing the squeegees and if there is a gap through which the balls can move between the substrate and the mask at such positions, the balls that fill the apertures of the mask will come out of the mask, so that balls cannot be disposed at the predetermined positions of the substrate. In addition, the balls that come out of the mask can stray across the surface of the substrate and be disposed at unintended positions, become trapped between the mask and the substrate, and/or become a factor that obstructs balls from filling other apertures.

On the other hand, the squeegees 22 of the head 20 of the filling device 5 according to the present embodiment press the periphery of the area 26 in which the conductive balls 15 are present. For this reason, in the area 26 in which the conductive balls 15 are to be present, the degree to which the mask 11 is horizontal is corrected, the mask 11 and the substrate 10 are kept parallel, and the gap between the mask 11 and the substrate 10 can be set at a value where the balls 15 do not flow out. When the head 200 is passed, parts of the mask 11 that have been passed by the head 20 may return to a bent or warped state. However, the conductive balls 15 are gathered in the area 26 and move together with the head 20. This means that the conductive balls 15 basically do not remain after the head 20 has moved, so that even if the mask 11 is warped or bent, risk of the conductive balls 15 straying is prevented. In addition, the conductive balls 15 that have filled the apertures 12 of the mask 11 are held at predetermined positions by the flux 17 on the surface of the substrate 10. Accordingly, even if the mask 11 may float above the surface of the substrate 10 when the head 20 passes, problems may not be occur. In this way, in the filling device 5 according to the present embodiment, minute particles can be reliably disposed at predetermined positions on the work 10 without omissions and without being affected by warping or bending of the mask 11.

The members 23 that construct the squeegees 22 need to push minute particles such as conductive balls that function as connection terminals of a semiconductor device with a suitable force and to sweep together the minute particles toward the area 26. Also, the sweep members 23 should preferably have a suitable elasticity so that the balls 15 that have been inserted into the apertures 12 are not brushed out. One suitable example of the sweep members 23 is the resin or metal wires shown in FIGS. 3 to 5 that extend in the longitudinal direction of the squeegees 22. For members 23 constructed by bending both ends of wires that extend in a longitudinal direction along the surface of the mask 11 in a U-shape and attaching the wires to the squeegee support 21, the lower central parts of the U-shaped wires contact the mask 11. Accordingly, the U-shaped wires 23 are pressed onto the mask 11 in a state where the wires 23 have a suitable elasticity so as to not damage the mask 11 and the outer parts of the wires do not brush out the balls 15 inserted into the holes of the mask 11. In addition, since the U-shaped wires 23 extend in a direction perpendicular to the direction of movement of the squeegees 22, such wires 23 are suitable as members for sweeping the balls 15. The wires 23 disposed in an overlapping state or in many layers on one squeegee 22 are suited to reliably sweeping together the balls 15 while flexibly contacting the mask 11. Also, the plurality of squeegees 22 arranged around the circular area 26 of the head 20 evenly gather the balls 15 from the entire surroundings of the area 26, and are also suited to reliably pressing a peripheral of the area 26.

FIG. 9 to FIG. 14 show different examples of a head. FIG. 9(a) shows a state where another head 20a is viewed from a base surface thereof, while FIG. 9(b) shows the head 20a from above when looking through the squeegee support 21. The head 20a includes the squeegee support 21 and twelve squeegees 22a that protrude from the lower surface 21a of the squeegee support 21 toward the surface 11a of the mask 11. The head 20a can be attached to the head supporting device 50 of the filling device 5 and used in place of the head 20 described above. The respective squeegees 22a are bundles of a plurality of superfine wires and are constructed to function as a single squeegee by crimping both ends 22r of the wires. The squeegees 22a are formed in overall U-shapes and are attached around the inner circle 26 of the rear surface 21a of the support 21 so as to extend substantially tangentially to the inner circle 26.

FIG. 10(a) shows yet another example head 20b when looking from a base surface thereof, while FIG. 10(b) shows the head 20b from above when looking through the squeegee support 21. The head 20b includes the squeegee support 21 and seven sets of squeegees 22b that protrude from the lower surface 21a of the squeegee support 21 toward the surface 11a of the mask 11. This head 20b can be attached to the head supporting device 50 of the filling device 5 and used in place of the head 20 described above. These squeegees 22b are formed by thin sheets of polyimide of U-shapes laminating together. As examples of this type of squeegee, it is possible to use single thin sheets of resin or metal or laminated such sheets. To avoid the effects of static electricity that may be produced between the squeegees 22b and the mask 11, one preferable example is metal squeegees. Also, squeegees made of plastic should preferably have their surfaces coated with a thin conductive film, such as copper foil, or be made conductive by including carbon. The front end parts of the squeegees that contact the mask 11 may also be edges. When the squeegees are constructed of thin films, the thin films may be bent back with the bent surfaces contacting the mask 11.

FIG. 11(a) shows yet another example head 20c when looking from a base surface thereof, while FIG. 11(b) shows the head 20c from above when looking through the squeegee support 21. The head 20c includes the squeegee support 21 and six sets of squeegees 22c that protrude from the lower surface 21a of the squeegee support 21 toward the surface 11a of the mask 11. These squeegees 22c are composed of conductive squeegees formed substantially as cuboids. This head 20c can also be attached to the head supporting device 50 of the filling device 5 and used in place of the head 20 described above.

Another example of the squeegees is constructed by attaching superfine wires made of resin or metal to the squeegee support 21 like the bristles of a brush. Also, the number of sets of squeegees is not limited to the numbers given above. In addition, although setting the squeegees in tangential directions for the inner circle 26 is one of favorable arrangements for the present invention, the present invention is not limited to such arrangement. The arrangement of squeegees may be any arrangement that functions as a sweeper to sweep together the balls to the area 26 due to the rotation of the head 20. For example, the squeegees may be disposed at angles to tangential directions for the inner circle 26, or the squeegees themselves may be curved or shaped as a part of spirals.

Figure 12:
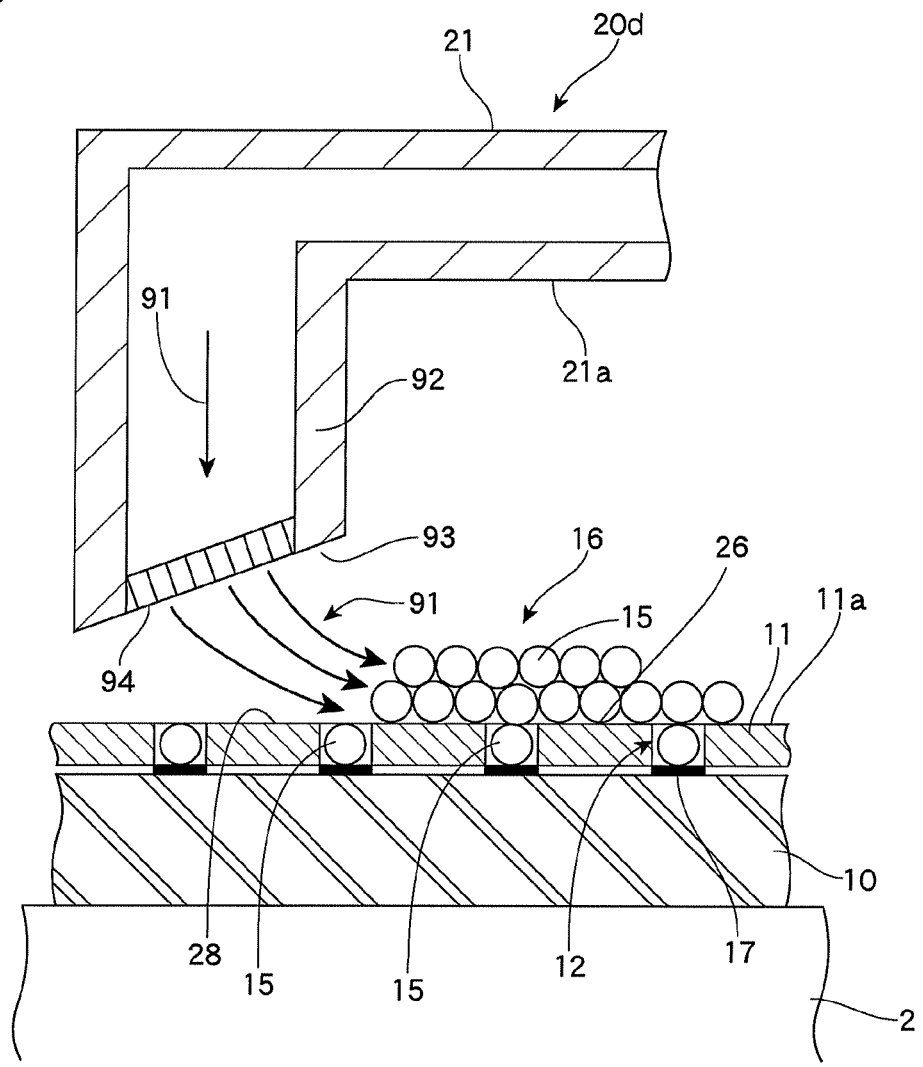
FIG. 12 is a cross-sectional view where yet another example of a head is partially enlarged.

FIG. 12 shows the construction of yet another example head 20d. The head 20d includes air nozzles 92 for blowing out gas 91 onto the surface 11a of the mask 11 to sweep together the balls 15. This head 20d can also be attached to the head supporting device 50 of the filling device 5 and used in place of the head 20 described above. The air nozzles 92 are attached to the support 21 in place of the squeegees. One example of the air nozzles 92 includes linear nozzle ends 93 that extend tangentially from the inner circle 26 to the outer circle 27 on the rear surface 21a of the support 21 in the same way as the various types of squeegees shown in the drawings described above. Filters 94 made of sintered metal or the like are attached to nozzle ends 93 and the air 91 is blown out diagonally downward through the filters 94 toward the surface 11a of the mask 11. The air 91 that has been blown out flows across and along the surface 11a of the mask 11 in the direction of the inner circle 26. It is possible to move the head 20 while having the air 91 blow the conductive balls 15 in the direction to the area 26 of the inner circle. In addition, the surface 11a of the mask around the area 26 for filling the balls is pressed due to the pressure of the air 91 blown onto the surface 11a of the mask and thereby warping and bending of the mask 11 can be corrected.

Air expelling parts of the air nozzles 92 may be constructed of groups of slits or minute cylindrical holes in place of the filters 94. Also, in place of the air 91, it is effective to use an inert gas such as nitrogen or argon gas, or an ionized gas for controlling the charge of the conductive balls.

In the head 20d that blows out gas such as air, the balls can be moved by the pressure of the air. Accordingly, by moving the head 20d in a freely chosen direction using the head supporting device 50, the filling device 5 can gather the balls 15 in the area 26 for filling without rotating the head 20d. It is also possible to rotate the head 20d to gather the balls 15 in the area 26 of the inner circle. This means that with a filling device 5 that uses only the head 20d that blows out gas for sweeping, it is possible to omit the motor 56 for rotating the head, and the construction of the head supporting device 50 can be simplified.

Figure 13:
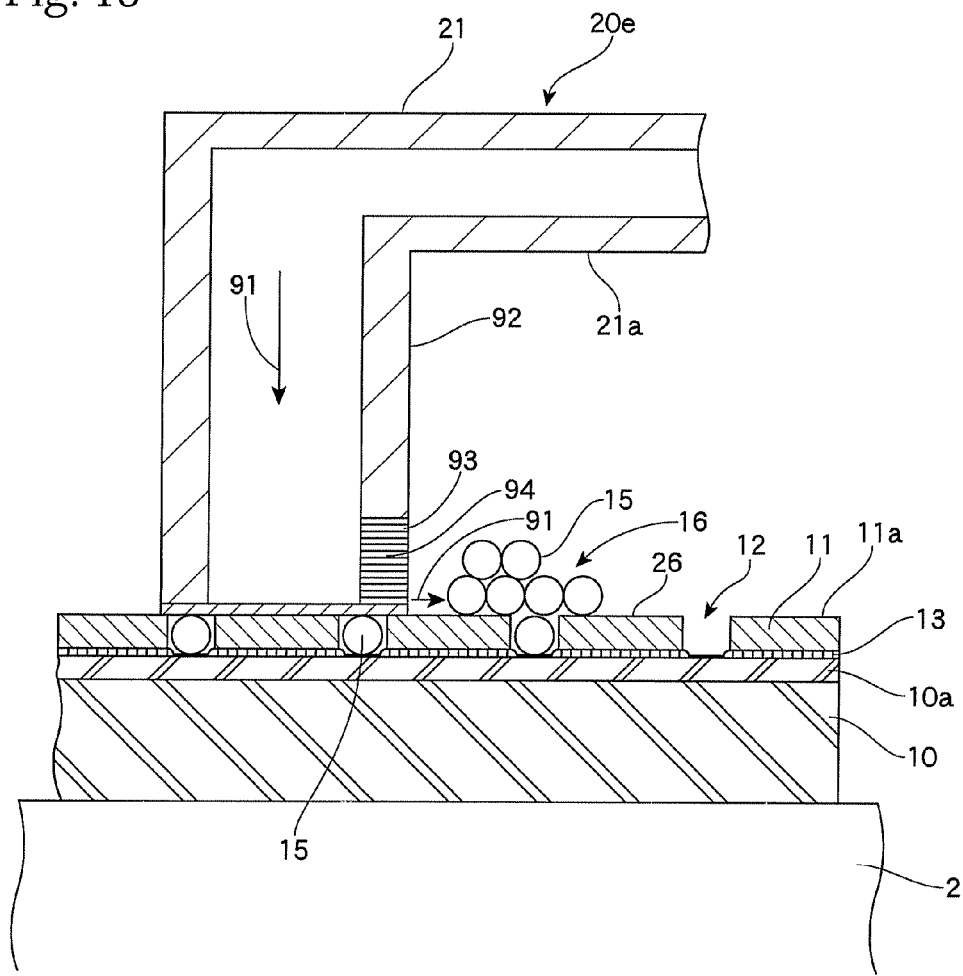
FIG. 13 is a cross-sectional view where yet another example of a head is partially enlarged.

FIG. 13 shows another example of a head that blows out air. This head 20e includes a squeegee support 21 and squeegee-type nozzles 92 that protrude from the lower surface 21a of the squeegee support 21 toward the surface 11a of the mask 11. As one example, the nozzles 92 are formed of elastic members such as rubber members, and contact the surface 11a of the mask 11 to press the mask. The nozzles 92 include outlets 93 oriented toward the inside and expel air 91 toward the inside to gather the conductive balls 15 in the area 26. This head 20e can also be attached to the head supporting device 50 of the filling device 5 and used in place of the head 20 described above. Since the conductive balls 15 can be moved by the expelled air 91, the head 20e is also a type where the conductive balls 15 can be swept together without rotating the head.

It should be noted that the substrate 10 shown in FIG. 13 includes a conductive layer 10a on a surface thereof and the conductive layer 10a is additionally covered by a protective film 13, with the resist 13 in the parts where the conductive balls 15 are mounted being removed by etching or the like. Accordingly, the mask 11 can be set on the substrate 10 so as to be tightly attached to the resist layer 13. In addition, the conductive balls 15 that fill the apertures 12 of the mask 11 are mounted in a state where there is electrical contact with the concave parts (the exposure portions 10a) of the substrate with the individual conductive balls 15 functioning as contact terminals.

Figure 14:
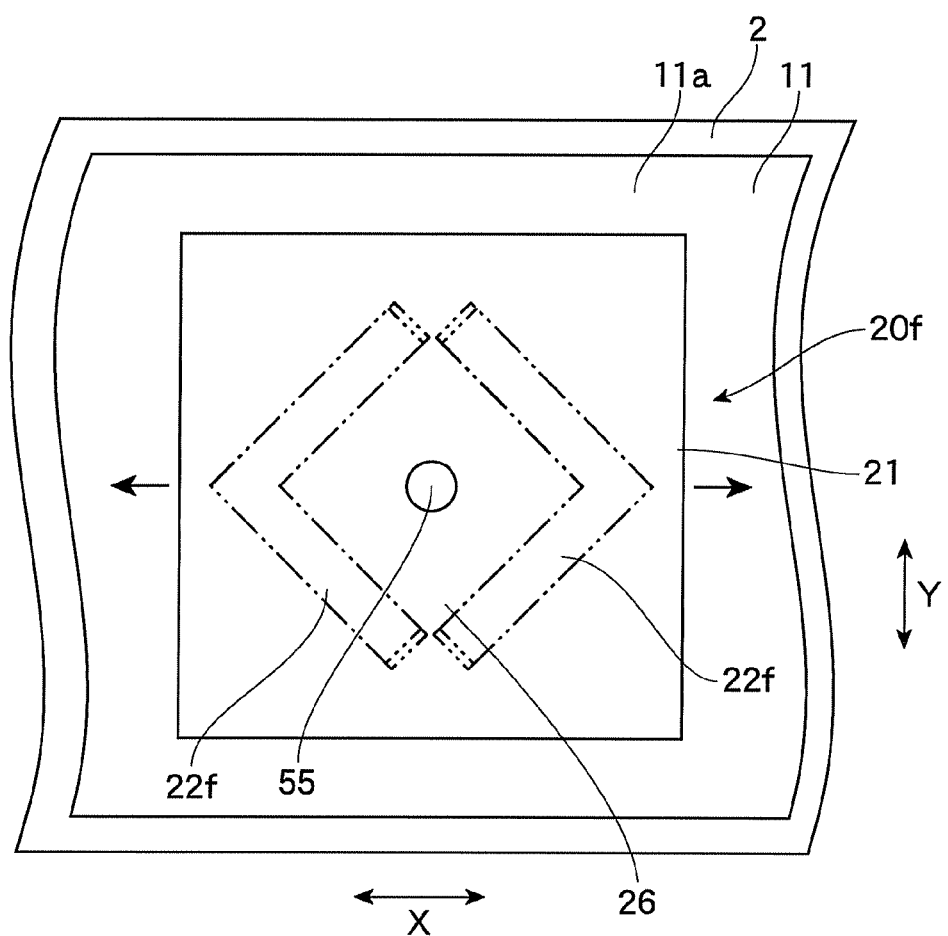
FIG. 14 is a view showing the construction of yet another example of a head when looking through the head from above.

FIG. 14 shows a state where yet another example of a head is viewed from above when looking through the squeegee support. The head 20f includes a rectangular squeegee support 21 and two sets of squeegees 22f that extend from the rear surface 21a of the squeegee support 21 toward the surface 11a of the mask 11, the squeegees 22f being in V-shapes when viewed from above. The two sets of squeegees 22f that are V-shaped are attached to the squeegee support 21 so as to face each other with a square area 26 formed in between. Accordingly, the conductive balls 15 are gathered in the area 26 between the squeegees 22f by oscillating or vibrating the head 20f in the left-right direction in FIG. 14, and the conductive balls 15 are filled or inserted in the apertures 12 of the mask 11 under their own weight in the area 26. In addition, since the surface 11a of the mask 11 in the periphery of the area 26 is pressed by the squeegees 22f, warping and the like of the mask 11 are corrected. The head 20f can move in a freely chosen direction in the XY plane while oscillating and with the conductive balls 15 held inside the area 26. Since the squeegees 22f vibrate so as to gather the conductive balls 15, unevenness in the distribution of the conductive balls 15 inside the area 26 can be reduced.

In the present invention, since the head rotates or oscillates (swings) and the head moves in a freely chosen direction, in most cases, the shape of the area 26 in which the conductive balls 15 are gathered will not be a geometric shape with a clear outline. However, in a head type where the balls are gathered while the head rotates, the area 26 becomes near or substantially circular. In addition, in a head type where the balls are gathered while the head vibrates, depending on the shapes of the squeegees, the area 26 can be circular or a polygon that is circumscribed on a circle. The polygon for the present invention is not limited to a square and includes triangles and also polygons with five or more sides.

It should be noted that the heads described above are merely a number of examples included in the present invention which is not limited to the above description. The head included in the present invention moves over the surface of the mask while holding conductive balls for filling in a group in a two-dimensional area of a limited size, with one favorable aspect of the head sweeping together the conductive balls from around the area for filling. In addition, by moving the head over the surface of the mask so that parts of the path overlap, it is possible to efficiently dispose or place the conductive balls in the apertures in the entire mask, so that the possibility of failure of filling balls into the apertures can be reduced.

The ball mounter 1 according to the present embodiment includes the mask handler 3 and the filling device 5 and may additionally include a device for conveying the substrate 10 and setting the substrate 10 on the table 2 and a device for applying flux onto the surface of the substrate 10. By using such devices, before the process that sets the mask and the process that fills the balls, processes such as setting the substrate on the table and applying the flux can be carried out. In addition, a system that carries out such processes in a series can be provided.

The invention claimed is:

1. A head that moves across a surface of a mask, which includes a plurality of apertures for disposing conductive balls on a substrate, whereby, while the head is rotating about an axis that is perpendicular to the mask, the axis moves across the surface of the mask, the head comprising a gatherer that gathers the conductive balls into a circular area that is smaller than the surface of the mask and disposed around a center of rotation of the head, the conductive balls being gathered from an area around the circular area when the head rotates.

2. The head according to claim 1, wherein the gatherer includes a sweeper for sweeping a part of the surface of the mask around the circular area by using members that protrude from the head or by blowing out gas.

3. The head according to claim 2, wherein the sweeper presses the part of the surface of the mask around the circular area by using the members that protrude from the head or by the blowing out gas.

4. The head according to claim 1, wherein the gatherer includes a plurality of squeegees that protrude from the head toward the surface of the mask and sweep a part of the surface of the mask around the circular area.

5. The head according to claim 4, wherein the plurality of squeegees extend in a tangential direction for the circular area.

6. The head according to claim 4, wherein the plurality of squeegees are arranged so as to overlap in a direction of movement thereof.

7. The head according to claim 4, wherein the plurality of squeegees press the part of the surface of the mask around the circular area.

8. The head according to claim 4, wherein the plurality of squeegees include resin or metal U-shaped wires.

9. The head according to claim 1, wherein the gatherer includes a nozzle for sweeping conductive balls by blowing out gas from the head to around the area.

10. The head according to claim 9, wherein the nozzle includes a filter made of sintered metal.

11. The head according to claim 1, wherein the axis moves across the surface of the mask in a traverse and/or longitudinal direction in an X-Y plane.

\* \* \* \* \*